United States Patent
Kenmochi

(10) Patent No.: US 7,061,975 B2
(45) Date of Patent: Jun. 13, 2006

(54) NONCYCLIC DIGITAL FILTER AND RADIO RECEPTION APPARATUS COMPRISING THE FILTER

(75) Inventor: Nobuhiko Kenmochi, Shiojisi (JP)

(73) Assignee: Seiko Epson Corporation, Tokyo (JP)

( * ) Notice: Subject to any disclaimer, the term of this patent is extended or adjusted under 35 U.S.C. 154(b) by 814 days.

(21) Appl. No.: 09/913,791

(22) PCT Filed: Dec. 18, 2000

(86) PCT No.: PCT/JP00/08980

§ 371 (c)(1),
(2), (4) Date: Aug. 16, 2001

(87) PCT Pub. No.: WO01/45256

PCT Pub. Date: Jun. 21, 2001

(65) Prior Publication Data

US 2002/0159515 A1    Oct. 31, 2002

(30) Foreign Application Priority Data

Dec. 16, 1999   (JP) .................................. 11-357951

(51) Int. Cl.
*H03K 1/159* (2006.01)
*G06F 17/15* (2006.01)
*H04B 1/707* (2006.01)

(52) U.S. Cl. ...................... 375/229; 375/343; 708/422; 708/425

(58) Field of Classification Search ................ 375/299, 375/143, 152, 343, 142, 150, 229; 708/250, 708/251, 252, 253, 254, 255, 256, 300, 314, 708/323, 422, 425; 370/320, 342, 335, 441

See application file for complete search history.

(56) References Cited

U.S. PATENT DOCUMENTS

| 4,369,499 A | * | 1/1983 | Northam .................... 708/319 |
| 4,777,612 A | * | 10/1988 | Tomimitsu .................. 708/316 |
| 4,817,025 A | * | 3/1989 | Asai et al. .................. 708/301 |
| 5,381,455 A | * | 1/1995 | Ovens et al. ................. 377/67 |
| 5,493,522 A | * | 2/1996 | Rosenberg ................. 708/491 |
| 5,533,012 A | * | 7/1996 | Fukasawa et al. .......... 370/342 |
| 5,946,344 A | * | 8/1999 | Warren et al. .............. 375/150 |

(Continued)

FOREIGN PATENT DOCUMENTS

EP    0 773 635 A2    5/1997

(Continued)

Primary Examiner—Betsy L. Deppe
(74) Attorney, Agent, or Firm—Oliff & Berridge PLC

(57) ABSTRACT

In accordance with the invention, in a nonrecursive digital filter, the number of times each bit of input data passes through a shift register is reduced to save power. Despreading data is sent to a first shift register and a second shift register, each having a number of stages obtained by dividing the usual number of stages by two, and both shift registers alternately perform a shift operation at both edges of a shift clock. Multiplexers are provided for selecting the odd-numbered codes of reference codes stored in a reference-code register when the shift clock is in an OFF state and for selecting the even-numbered codes when the shift clock is in an ON state, and multiplexers are provided that perform the selections analogous to the above. The exclusive-OR output of the output of each stage of the first shift register and the outputs of the multiplexers, and the exclusive-OR output of the output of each stage of the second shift register, and the outputs of the multiplexers are added by the adder to obtain a correlation-strength output.

2 Claims, 5 Drawing Sheets

U.S. PATENT DOCUMENTS 6,198,649 B1 * 3/2001 Matsudera et al. ........... 365/63
6,272,168 B1 * 8/2001 Lomp et al. ................ 375/222
6,373,827 B1 * 4/2002 Tayebi et al. ............... 370/310

FOREIGN PATENT DOCUMENTS

| EP | 0 855 796 A2 | 7/1998 |
| JP | A 63-253713 | 10/1988 |
| JP | A 4-271507 | 9/1992 |
| JP | A 10-178386 | 6/1998 |
| JP | A 10-190664 | 7/1998 |
| JP | A 11-251965 | 9/1999 |
| JP | A 11-312952 | 11/1999 |

* cited by examiner

NONCYCLIC DIGITAL FILTER AND RADIO RECEPTION APPARATUS COMPRISING THE FILTER

BACKGROUND OF THE INVENTION

1. Field of Invention

The present invention relates to nonrecursive digital filters using shift registers, such as matched filters, used for cell-synchronization capturing and demodulation-synchronization capturing in spread spectrum communication systems and CDMA communication systems, and radio receiving units using the nonrecursive digital filters.

2. Description of Related Art

Japanese Unexamined Patent Application Publication No. Hei-10-178386 discloses a matched filter serving as a nonrecursive digital filter in a conventional CDMA system.

In this conventional system, packets to which spectrum spreading modulation has been applied by the use of spreading codes are transmitted, they are received by an antenna and demodulated by a receiving demodulation section. The received signal is spectrum-spreading-modulated by the use of the spreading codes, and the received signal is sent to a matched filter. This matched filter is formed of a shift register for receiving and shifting the received signal, having, for example, 64 bits; a register for setting a spreading-code sequence having the same number of bits as the shift register; a multiplier for multiplying the outputs of the shift register and the register bit by bit; and an adder for adding the output signals of the multiplier. The received signal is formed of packets and includes a preamble section and a data section. The received signal is sampled, for example, at the chip period of the spreading codes, and is converted to digital values falling between −1.0 and +1.0 by A/D conversion. The shift register shifts the received signal at the chip period according to the sampling period of the received signal. In general, to increase the precision of a correlated value, a structure is used in which the received signal is over-sampled, that is, sampled at a period shorter than the chip period of the spreading codes, and is A/D converted, and the shift register shifts the received signal according to the sampling period.

SUMMARY OF THE INVENTION

In the conventional nonrecursive digital filter, however, since a shift register having the number of stages corresponding to the number of bits in the spreading-code sequence corresponding to the received signal is provided, and the received signal is sequentially shifted and stored in the shift register, when the spreading-code sequence has eight bits at a transmission rate of 1.6 MHz, a chip frequency is 1.6×8=12.8 MHz and the shift register repeats switching at a high speed, resulting in high power consumption. Since the nonrecursive digital filter uses a great part of its power consumption during receiving in a base-band chip used for a portable phone employing CDMA, a demand for reducing power cannot be satisfied.

The present invention overcomes this problem with the conventional system. An object of the present invention is to provide a nonrecursive digital filter having reduced power consumption, and to provide a radio receiving unit using the nonrecursive digital filter.

To achieve the foregoing object, the invention provides a nonrecursive digital filter which has an n-stage shift register that sequentially shifts input data having a predetermined number n of bits and in which the output of each output stage of the shift register is multiplied by a filter coefficient and added. The n-stage shift register is divided into a plurality of shift registers, and each divided shift register is time-divisionally driven in synchronization with the input data.

Since each divided shift register performs a time-divisional shift operation in synchronization with the input data, high-speed switching of the shift registers is reduced and power saving is implemented by reducing the clock rate of a shift clock used when the shift register is formed of n stages.

The invention also provides a nonrecursive digital filter which has an n-stage shift register that sequentially shifts input data having a predetermined number n of bits and in which the output of each output stage of the shift register is multiplied by a filter coefficient and added. The n-stage shift register is divided into first and second shift registers each having n/2 stages, and one of the first and second shift registers performs a shift operation at a rising edge of a shift clock, and the other performs a shift operation at a falling edge of the shift clock.

Since the n-stage shift register is divided into shift registers, each having the half number of stages, one of them stores the odd-numbered parts of the spreading-code sequence and performs a shift operation at a rising edge of the shift clock, and the other stores the even-numbered parts of the spreading-code sequence and performs a shift operation at a falling edge of the shift clock. The clock rate of a shift clock used when the shift register is formed of n stages can be halved to save power.

The invention also provides a nonrecursive digital filter which has an n-stage shift register that sequentially shifts input data having a predetermined number n of bits and in which the output of each output stage of the shift register is multiplied by a filter coefficient and added. The filter includes: first and second shift registers to which a spreading-code sequence is inputted and a shift clock is inputted, each having n/2 stages obtained by dividing the n-stage shift register; a reference-code register that stores n reference codes; first and second selection devices that select and output the odd-numbered stages and even-numbered stages of the reference-code register according to the shift clock; a first multiplication device that multiplies the output of each stage of the first shift register by the output of the first selection device; a second multiplication device that multiplies the output of each stage of the second shift register by the output of the second selection device; and a correlation-strength calculation device that adds the multiplication results of the first multiplication device and the second multiplication device to output a correlation strength. The first and second shift registers are configured such that either one of them performs a shift operation at a rising edge of the shift clock and the other performs a shift operation at a falling edge of the shift clock. The first and second selection devices are configured such that, when the shift clock is in an ON state, one of them outputs the even-numbered stages of the reference-code register to the first multiplication device, and the other outputs the odd-numbered stages to the second multiplication device, and when the shift clock is in an OFF state, the one of the first and second selection devices outputs the odd-numbered stages of the reference-code register to the first multiplication devices and the other of the first and second selection devices outputs the even-numbered stages to the second multiplication device.

The matched filter is provided, and for example, the first shift register sequentially shifts the odd-numbered parts of an input code sequence at rising edges of the shift clock, and the second shift register sequentially shifts the remaining parts, the even-numbered parts, of the code sequence at falling edges of the shift clock. When the shift clock is in an ON state, the first selection device outputs the even numbers of the reference-code register to the first multiplication device, and the second selection device outputs the odd-numbered stages of the reference-code register to the second multiplication device, and when the shift clock is in an OFF state, the first selection device outputs the odd-numbered stages of the reference-code register to the first multiplication device, and the second selection device outputs the even-numbered stages of the reference-code register to the second multiplication device. Therefore, the first and second multiplication device multiplies the output of each output stage of the first shift register by the output of the first selection device at points of time slightly later than the points of time the shift clock rises and the points of time the shift clock falls, and the results of multiplication are added by the correlation-strength calculation device to output a correlation output.

The invention also provides a nonrecursive digital filter, wherein the first and second selection devices are formed of multiplexers, each disposed for two stages of the reference-code register and selecting the odd-numbered stages and even-numbered stages thereof. The first and second multiplication devices are formed of exclusive-OR circuits. The correlation-strength calculation device is formed of an adder.

After the first and second shift registers perform shift operations, since each multiplexer performs a switching operation to alternately select the odd-numbered stages and multiple stages of the reference-code register according to the ON or OFF state of the shift clock to output the reference code to the exclusive-OR circuits to which the output of each stage of the first and second shift registers are inputted, the correlation output of an eight-bit code sequence is obtained by four pulses of the shift clock.

The invention also provides a radio receiving unit that employs a CDMA method for performing operations including path synchronization holding, in response to a spread-spectrum signal being received from a base station. The unit includes: an RF receiving section that converts a received signal into a base-band signal; a correlation section that holds an input digital signal, that holds a spreading code as a reference code, and that performs inverse spectrum conversion while calculating a correlation therebetween, to output received data; and a base-band demodulation section that demodulates the received data. The input side of one of the correlation section and the base-band demodulation section is connected to the RF receiving section, and the output side thereof is connected to the other. The correlation section includes a matched filter formed of a nonrecursive digital filter according to one of those described above.

The base-band signal output from the RF receiving section undergoes spectrum despreading in the correlation section to form received data and the received data is demodulated by the base-band demodulation section, or the base-band signal output from the RF receiving section is demodulated by the base-band demodulation section and undergoes spectrum despreading by the correlation section. CDMA data is received, and the correlation section includes a matched filter formed of a nonrecursive digital filter as described above.

The invention also provides a radio receiving unit that transmits information data in packets by a spread spectrum communication method, which directly performs spreading, in a radio local-area network formed with another radio communication terminal. The unit includes: an RF receiving section that converts received information data into a base-band signal; a correlation section that holds an input digital signal, that holds a spreading code as a reference code, and that performs inverse spectrum conversion while calculating a correlation therebetween, to output received data; a base-band demodulation section that demodulates the received data; and a packet processing section that performs packet processing according to the received data. The input side of one of the correlation section and the base-band demodulation section is connected to the RF receiving section, and the output side thereof is connected to the other. The output side thereof is connected to the packet processing section. The correlation section includes a matched filter formed of a nonrecursive digital filter according to one described above.

The base-band signal output from the RF receiving section undergoes spectrum despreading in the correlation section to form received data and the received data is demodulated by the base-band demodulation section, or the base-band signal output from the RF receiving section is demodulated by the base-band demodulation section and undergoes spectrum despreading by the correlation section. Data is received in the radio local-area network. The correlation section includes a matched filter formed of a nonrecursive digital filter according to one described above.

DETAILED DESCRIPTION OF PREFERRED EMBODIMENTS

Figure 1:
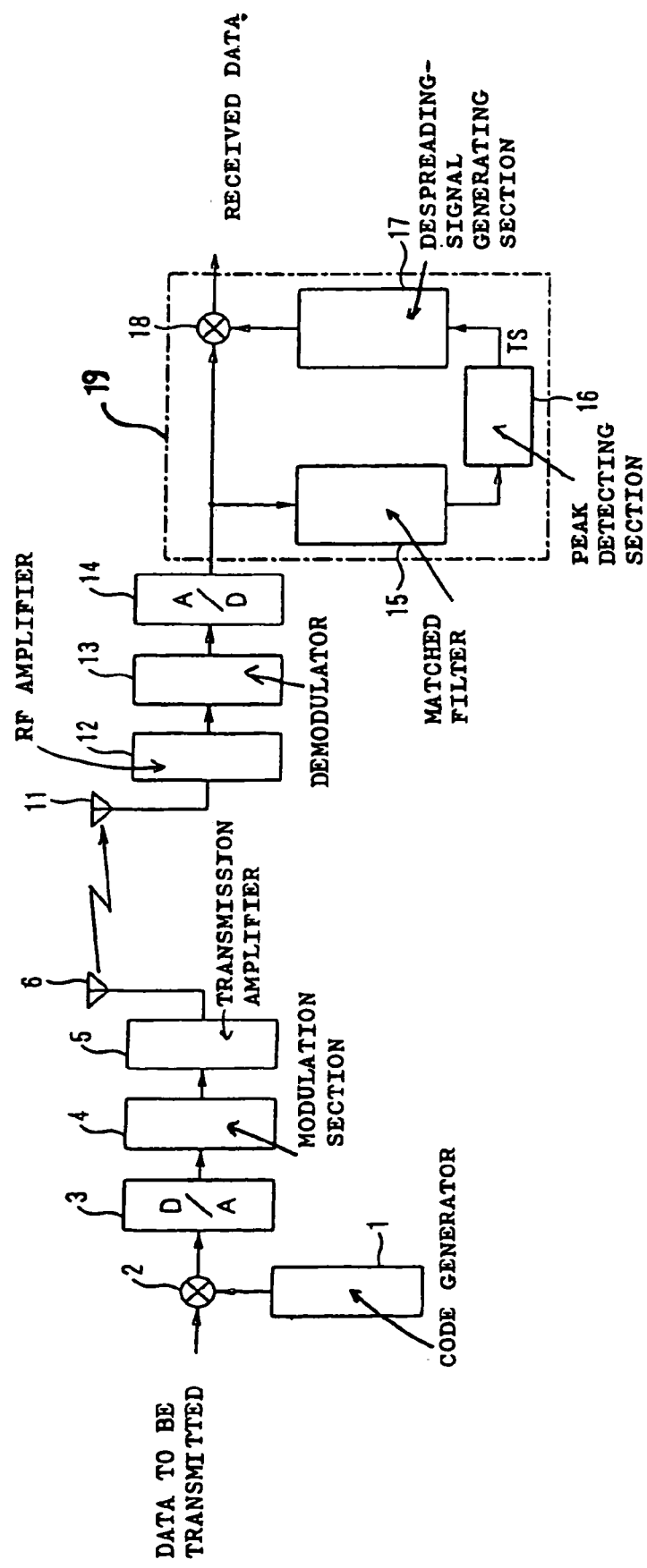
FIG. 1 is a block diagram of an embodiment in a case in which the present invention is applied to a CDMA communication system.

Embodiments of the present invention will be described below by referring to the drawings.

FIG. 1 is a general structural view showing a case in which the present invention is applied to a CDMA (code division multiple access) communication system. In a radio transmitter, data to be transmitted and a spreading code C(t) having a predetermined number of bits, n bits, generated by a code generator 1 are multiplied by a multiplier 2 to form spreading data; and the spreading data is converted to an analog signal by a D/A converter 3, is modulated by a modulation section 4, is amplified by a transmission amplifier 5, and is transmitted from a transmission antenna 6.

In a radio receiver, the spreading data is received by a receiving antenna 11, is RF-amplified by an RF amplifier 12, is demodulated by a demodulator 13, is converted to a digital signal by an A/D converter 14 to form despreading data; and the despreading data is inputted to a correlation section 19. In the correlation section 19, the despreading digital data output from the A/D converter 14 is sent to a matched filter 15 serving as a nonrecursive digital filter to obtain the sum of products (correlation output) with a despreading code C; the sum is sent to a peak detecting section 16 to obtain a synchronization capturing signal; the synchronization capturing signal is sent to a despreading-signal generating section 17 to generate a despreading code C(t); and the despreading code C(t) is multiplied by the despreading data output from the A/D converter 14 in a multiplier 18 to reproduce received data which is the same as the transmitted data.

Figure 2:
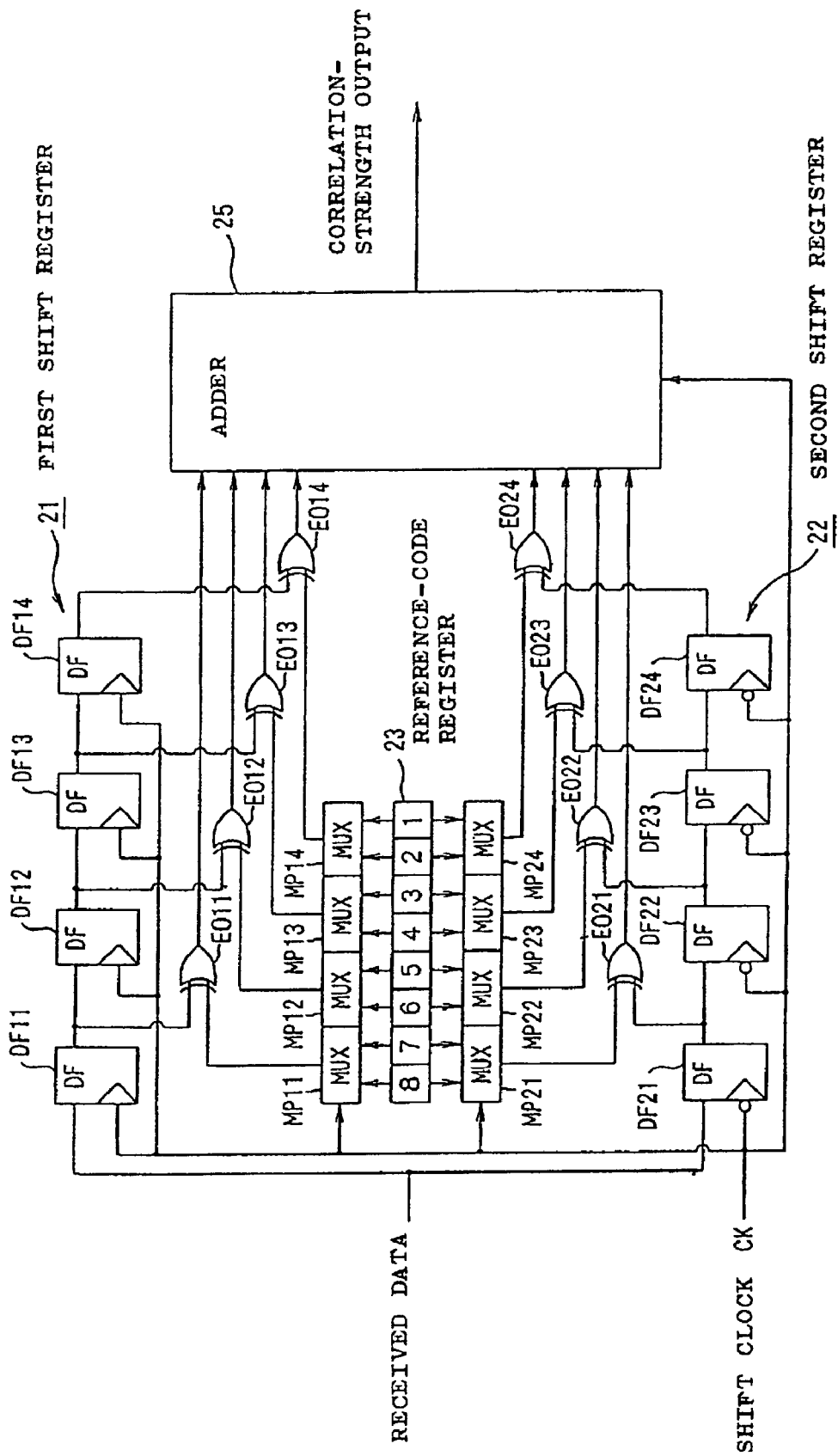
FIG. 2 is a block diagram of a matched filter constituting a nonrecursive digital filter of the present invention.

As shown in FIG. 2, in the matched filter 15, when the despreading data has eight bits, a first shift register 21 formed by connecting in series four D flip-flops DF11 to DF14 that receive the odd-numbered parts of the spreading code sequence and that shift them is connected in parallel to a second shift register 22 formed by connecting in series four D flip-flops DF21 to DF24 that receive the even-numbered parts of the despreading data and for shifting them; and a reference-code register 23 that stores the eight-bit despreading code is provided.

The reference-code register 23 is connected at one output side to four multiplexers MP11 to MP14 constituting a first selection device, and is connected at the other output side to four multiplexers MP21 to MP24 constituting a second selection device.

The outputs of the multiplexers MP11 to MP14 and those of the D flip-flops DF11 to DF14 are inputted to exclusive-OR circuits EO11 to EO14 constituting a first multiplier device; the outputs of the multiplexers MP21 to MP24 and those of the D flip-flops DF21 to DF24 are inputted to exclusive-OR circuits EO21 to EO24 constituting a second multiplier device; the output of each of the exclusive-OR circuits EO11 to EO14 and EO21 to EO24 is input to an adder 25; the adder 25 adds the output of each of the exclusive-OR circuits EO11 to EO14 and EO21 to EO24 at points of time slightly later than a shift clock CK rises and falls to calculate a correlation strength; and the correlation strength is output to the peak detecting section 16.

The shift clock CK, having the period corresponding to two bits of the received data, is inputted to the first shift register 21 and to the second shift register 22. At a point of time the shift clock CK rises from an OFF state to an ON state, each of the D flip-flops DF11 to DF14 of the first shift register 21 performs a shift operation, and at a point of time the shift clock CK falls from an ON state to an OFF state, each of the D flip-flops DF21 to DF24 of the second shift register 22 performs a shift operation.

The shift clock CK is also inputted to each of the multiplexers MP11 to MP14; and the multiplexers select the outputs of the even-numbered stages of the reference-code register 23 when the shift clock CK is in an ON state, and select the outputs of the odd-numbered stages of the reference-code register 23 when the shift clock CK is in an OFF state, to output them to the exclusive-OR circuits EO11 to EO14.

The shift clock CK is also inputted to each of the multiplexers MP21 to MP24; and the multiplexers select the outputs of the odd-numbered stages of the reference-code register 23 when the shift clock CK is in an ON state, and select the outputs of the even-numbered stages of the reference-code register 23 when the shift clock CK is in an OFF state, to output them to the exclusive-OR circuits EO21 to EO24.

Figure 3:
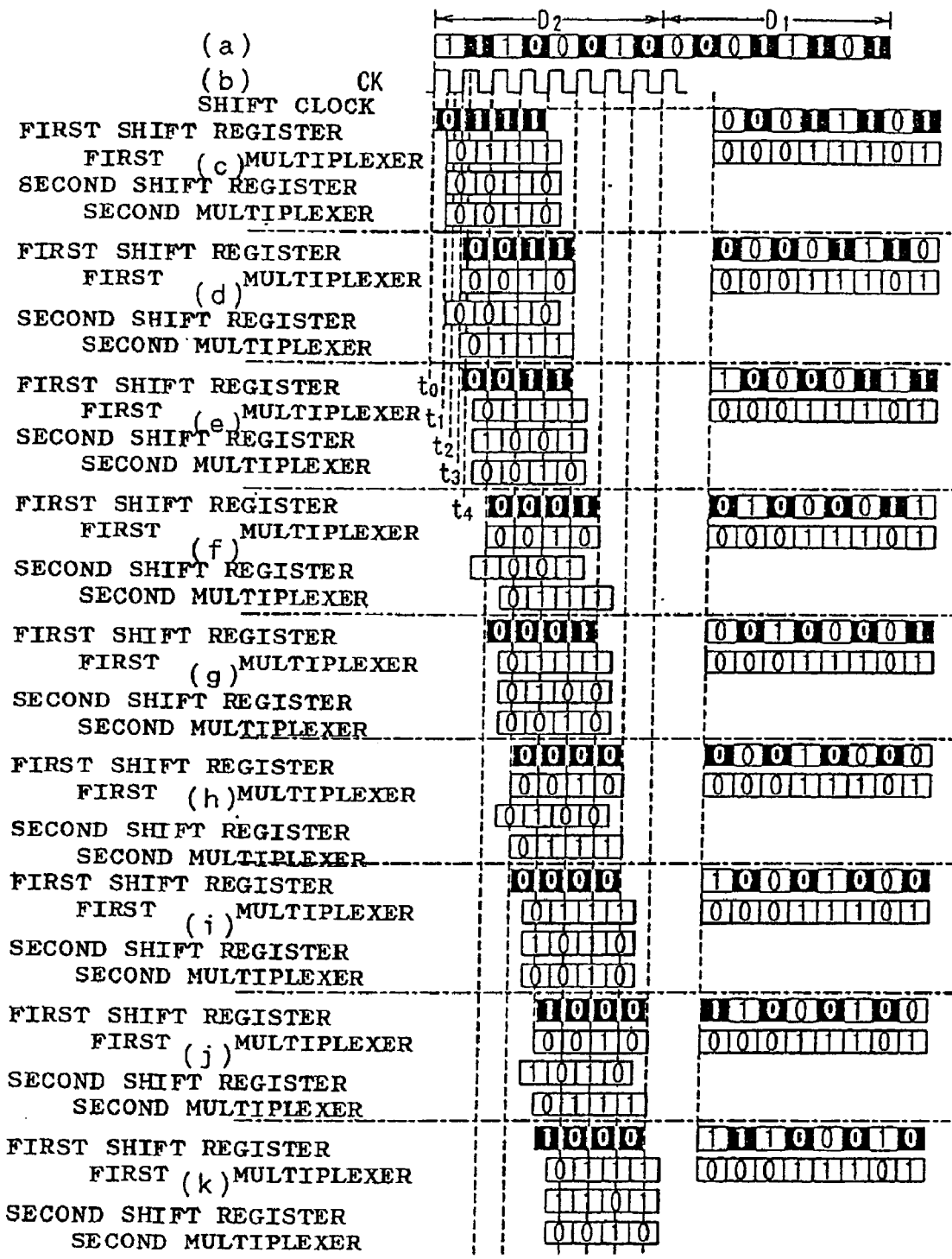
FIG. 3 is a timing chart of the operations of the matched filter.

An operation in the above embodiment will be described next by referring to the timing chart of FIG. 3.

It is assumed that the radio transmitter sends transmission data D1 and D2 each formed of an eight-bit spreading code C(t) and indicating data of "1" or "0" as shown in FIG. 3(a), in the order of the rightmost bit D11, D12, D13, . . . to the receiving side.

In the radio receiver, the transmission data D1 and D2 is received by the receiving antenna 11, is RF-amplified by the RF amplifier 12, is demodulated by the demodulator 13, and is converted to digital data by the A/D converter 14 to form despreading data. Then, the despreading data is sent to the matched filter 15 in the correlation section 19, a correlation calculation with the despreading code C is performed by the matched filter 15, and a correlation strength output is output to the peak detecting section 16.

The peak detecting section detects the maximum and minimum peaks of the correlation strength output to generate a synchronization capturing signal TS and sends it to the despreading-code generator 17. The despreading-code generator 17 generates a despreading-code sequence C(t) in synchronization with the synchronization capturing signal TS, and sends it to the multiplier 18, so that the multiplier 18 multiplies the despreading data by the despreading-code sequence C(t) to reproduce received data which is the same as the transmission data.

In the matched filter 15, it is assumed that the reference-code register 23 stores reference codes of C8, C7, C6, C5, C4, C3, C2, and C1 sequentially from the leftmost output stage, which have a value of "00011101," as shown in a second row at the right-hand side in each of the FIGS. 3(c) to 3(k). When the despreading data shown in FIG. 3(a) is inputted in this state, the odd-numbered data D11, D13, . . . , which is indicated by white numerals in black backgrounds, is sequentially stored in the first shift register 21 at points of time the shift clock CK shown in FIG. 3(b) and inputted in synchronization with the despreading data rises, and the even-numbered data D12, D14, . . . is sequentially stored in the second shift register 22 at points of time the shift clock CK falls.

The multiplexers MP11 to MP14 select the odd-numbered codes C7, C5, C3, and C1 of the reference-code register 23, which have a value of "0111" when the shift clock CK is in an OFF state, and select the even-numbered codes C8, C6, C4, and C2 of the reference-code register 23, which have a value of "0010" when the shift clock CK is in an ON state. In contrast, the multiplexers MP21 to MP24 select the even-numbered codes C8, C6, C4, and C2 of the reference-code register 23, which have a value of "0010" when the shift clock CK is in an OFF state, and select the odd-numbered codes C7, C5, C3, and C1 of the reference-code register 23, which have a value of "0111" when the shift clock CK is in an ON state.

Therefore, in a case in which the first eight-bit despreading data D1 of "00011101", shown in FIG. 3(a), is alternately inputted to the first shift register 21 and the second shift register 22 at both rising and falling edges of the shift clock CK; and odd-numbered data bits D15, D13, and D11 having a value of "111" are stored in the D flip-flops DF11, DF12, and DF13 of the first shift register 21, respectively, as shown in FIG. 3(c), when the shift clock CK rises at a point to of time as shown in FIG. 3(b), the data of "111" which has been stored so far in the flip-flops DF11 to DF13 is shifted and stored in DF12 to DF14, and the last odd-numbered data D17 having a value of "0" is stored in the flip-flop DF11, whereby the D flip-flops DF11, DF12, DF13, and DF14 of the first shift register 21 store the odd-numbered data D17, D15, D13, and D11 having a value of "0111," as shown in FIG. 3(c).

Next, in a case in which the first three even-numbered data bits D16, D14, and D12 having a value of "010" are stored in the D flip-flops DF21, DF22, and DF23 of the second shift register 22, when the shift clock CK falls at a point t1 of time, the data of "010" which has been stored in the flip-flops DF21 to DF23 so far is shifted and stored in DF22 to DF24, and the last even-numbered data D18 having a value of "0" is stored in the flip-flop DF21, whereby the D flip-flops DF21, DF22, DF23, and DF24 of the second shift register 22 store the even-numbered data D18, D16, D14, and D12 having a value of "0010," as shown in FIG. 3(c).

At a point t2 of time slightly later than the point t1 of time, since the shift clock CK is in an OFF state, the multiplexers MP11, MP12, MP13, and MP14 serving as the first selection device select the odd-numbered outputs of the reference-code register 23. Therefore, the multiplexers MP11, MP12, MP13, and MP14 output the odd-numbered codes C7, C5, C3, and C1 of the reference code C, having a value of "0111" as shown in FIG. 3(c). In the same way, since the multiplexers MP21, MP22, MP23, and MP24 serving as the second selection device select the even-numbered outputs of the reference-code register 23, the multiplexers MP21, MP22, MP23, and MP24 output the even-numbered codes C8, C6, C4, and C2 of the reference code C, having a value of "0010" as shown in FIG. 3(c).

As a result, of the data stored in the first and second shift registers 21 and 22, the despreading data D1 will be stored in the order as shown in a first row at the right-hand side in FIG. 3(c), and the reference codes selected by the multiplexers MP11 to MP14 and MP21 to MP24 will be stored as shown in the second row at the right-hand side in FIG. 3(c). This means that a shift operation will be performed that is equivalent to a conventional-operation in which eight D flip-flops are connected in series.

Therefore, since the input data of each of the exclusive-OR circuits EO11 to EO14 is the same, all the circuits output low-level data. In addition, since the input data of each of the other exclusive-OR circuits EO21 to EO24 is also the same, all the circuits output low-level data. Consequently, the correlation strength output calculated by the adder 25 has the minimum level, 0. This output is sent to the peak detecting section 16, and the peak detecting section 16 determines that it is the minimum peak value and sends a pulse-shaped synchronization capturing signal TS to the despreading-code generator 17 to start outputting the despreading-code sequence C(t) to the multiplier 18.

When the shift clock CK rises at a point t3 of time, first data D21 having a value of "0" of the despreading data D2 following the despreading data D1 is stored in the D flip-flop DF11 of the first shift register 21, as shown in FIG. 3(d). Therefore, the data in the flip-flops DF11 to DF14 is shifted, and the stored data becomes "0011." Since the flip-flops DF21 to DF24 of the second shift register 22 do not perform a shift operation at this time, the previously stored data of "0010" is maintained.

At a point t4 of time slightly later than the point t3 of time, since the shift clock CK is in an ON state, the multiplexers MP11, MP12, MP13, and MP14 serving as the first selection device select the even-numbered outputs of the reference-code register 23, and the multiplexers MP11, MP12, MP13, and MP14 output the even-numbered codes C8, C6, C4, and C2 of the reference code C, having a value of "0010" as shown in FIG. 3(d). In contrast, the multiplexers MP21, MP22, MP23, and MP24 serving as the second selection device output the odd-numbered codes C7, C5, C3, and C1 of the reference code C, having a value of "0111" as shown in FIG. 3(d).

As a result, as shown in a first row at the right-hand side of FIG. 3(d), the content of the first shift register is the even-numbered data obtained when a shift operation is performed in the same way as in the conventional case, and the content of the second shift register is the odd-numbered data, and the reference codes are switched accordingly, thus a shift operation equivalent to that performed conventionally when eight D flip-flops are connected in series is performed.

Therefore, the exclusive-OR circuits EO11 to EO13 output low-level data, the exclusive-OR circuit EO14 outputs high-level data, the exclusive-OR circuits EO21 and EO23 output low-level data, and the exclusive-OR circuits EO22 and EO24 output high-level data. Thus, the adder 25 outputs a correlation strength of "3" and the peak detecting section 16 determines that this output is not a peak value and stops outputting the synchronization capturing signal TS.

Then, at a point of time when the shift clock CK falls as shown in FIG. 3(e), first even-numbered data D22 having a value of "1" of the despreading data D2 is stored in the second shift register 22. Therefore, the content of the shift register is updated to "1001" by a shift operation. Since the first shift register 21 does not perform a shift operation at this time, it maintains "0011" as shown in FIG. 3(e). The multiplexers MP11 to MP14 output the odd-numbered codes C7, C5, C3, and C1 of the reference code C, having a value of "0111" as shown in FIG. 3(e). The multiplexers MP21 to MP24 output the even-numbered codes C8, C6, C4, and C2 of the reference code C, having a value of "0010" as shown in FIG. 3(e). Also in this case, as shown in a first row at the right-hand side in FIG. 3(e), a shift operation equivalent to an eight-stage shift operation is performed.

Therefore, the exclusive-OR circuits EO11, EO13, EO14, and EO22 output low-level data, and the remaining exclusive-OR circuits EO12, EO21, EO23, and EO24 output high-level data, thus the adder 25 outputs a correlation strength of "4" to the peak detecting section 16, and the peak detecting section 16 determines that this output is not a peak value and continues the state in which the output of the synchronization capturing signal TS is being stopped.

Then, at rising edges and falling edges of the shift clock CK, as shown in FIG. 3(f) to FIG. 3(j) sequentially, odd-numbered data D23 of the despreading data D2 is stored in the first shift register 21, even-numbered data D24 is stored in the second shift register 22, odd-numbered data D25 is stored in the first register 21, and even-numbered data D26 is stored in the second shift register 22; correlation strengths of "5," "4" "3" "4," and "5" are output; and the peak detecting section 16 determines that the outputs are not peak values and continues the state in which the output of the synchronization capturing signal TS is being stopped.

Then, as shown in FIG. 3(k), the last even-numbered data D28 having a value of "1" of the despreading data D2 is stored in the flip-flop DF21 of the second shift register 22, the content thereof becomes "1101, and the first shift register 21 maintains its content of "1000." As a result, as shown in a first row at the right-hand side of FIG. 3(k), the data stored in the first shift register 21 is the odd-numbered data obtained when an eight-stage shift register is used, and the data stored in the second shift register 22 is the even-number data.

Immediately after this state, since the shift clock CK is in an OFF state, the multiplexers MP11 to MP14 select the odd-numbered codes C7, C5, C3, and C1 having a value of "0111" of the reference code C stored in the reference-code register 23, and the multiplexers MP21 to MP24 select the even-numbered codes C8, C6, C4, and C2 having a value of "0010" of the reference code C. Therefore, the exclusive-OR circuits EO11 to EO14 and EO21 to EO24 all output high-level data. The adder 25 outputs a correlation strength of "8" and sends it to the peak detecting section 16, and the peak detecting section 16 determines that it is the maximum peak value and outputs a pulse-shaped synchronization capturing signal TS. In response to this output, the despreading-code generator 17 outputs a despreading-code sequence C(t) again, and the multiplier 18 multiplies the sequence by the next despreading data D3 to reproduce received data which is the same as the transmission data.

As described above, according to the above embodiment, the shift register is divided into the first shift register 21 and the second shift register 22, each having the number of stages half the number of bits of the spreading code and the registers are connected in parallel; one of the registers performs a shift operation at rising edges of the shift clock CK and the other performs a shift operation at falling edges of the shift clock CK; the multiplexers MP11 to MP14 and MP21 to MP24 select the odd-numbered and the even-numbered parts of the reference code stored in the reference-code register 23 according to the ON and OFF states of the shift clock CK; the output of each stage of each shift register and the outputs of the multiplexers M11 to MP14 and MP21 to MP24 are sent to the exclusive-OR circuits EO11 to EO14 and EO21 to EO24; when they do not match, a high-level output is obtained, and each output is added by the adder 25 to obtain a correlation-strength output; thus when eight-bit despreading data is reproduced, only four pulses of the shift clock CK are required and each bit passes through just four D flip-flops. Therefore, eight pulses and eight flip-flops through which each data passes, required when an eight-stage shift register is used as in the conventional case, are halved, the clock rate of the shift clock CK can be reduced to its half, and a high power saving is implemented. In this case, although the multiplexers MP11 to MP14 and MP21 to MP24 perform additional switching operations, since each reference code has only one bit, an advantage obtained when the number of times the multiple-bit shift register switches is reduced is much greater than the disadvantage of the additional switching operations. Therefore, the power consumption of the entire radio receiver using the matched filter 15 is reduced, and a built-in battery can be used for a longer period.

In the above embodiment, the spreading code has eight bits. The number of bits the spreading code has is not limited to this case. The spreading code can have any number of bits.

In the above embodiment, the reference code corresponding to the despreading data D1 is stored in the reference-code register 23. Data to be stored is not limited to this code. The reference code corresponding to the despreading code D2 may be stored. Despreading data may be manipulated such that the odd-numbered bits and even-numbered bits are switched to form a reference code. In this case, selections made by the multiplexers MP11 to MP14 and MP21 to MP24 according to the shift clock CK need to be made reverse to those performed in the above embodiment. The circuit structure may be configured such that two reference-code registers are provided to store the odd-numbered codes and the even-numbered codes of the reference code corresponding to the despreading data D1 or D2; the two registers are selected by multiplexers; and the selected data is sent to the exclusive-OR circuits EO11 to EO14 and EO21 to EO24.

The number of divisions made for a shift register is not limited to two. It may be set to any value, such as three or four. The number of bits to be selected in the output stages of the reference-code register 23 needs to be increased accordingly.

Figure 4:
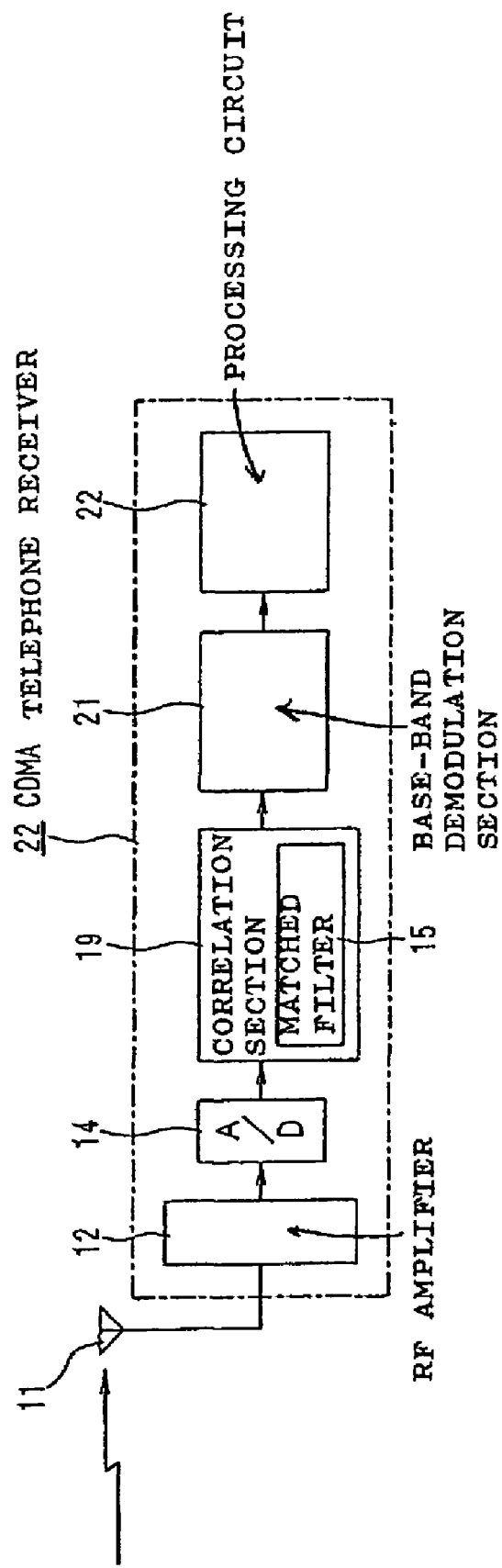
FIG. 4 is a block diagram of a modification of the embodiment shown in FIG. 1.

In the above embodiment, a base-band signal output from the RF amplifier 12 is demodulated by the demodulator 13, is converted to a digital signal by the A/D converter 14, and is sent to the correlation section 19 in the radio receiver. The circuit structure is not limited to this structure. As shown in FIG. 4, a CDMA telephone receiver 220 may be configured such that a base-band signal is amplified by the RF amplifier 12, is converted to a digital signal by the A/D converter 14, is sent to the correlation section 19 having the matched filter 15 shown in FIG. 2 to undergo spectrum despreading, is demodulated by a base-band demodulation section 21, and is sent to a processing circuit 221.

In the above embodiment, the present invention is applied to the matched filter. The application is not limited to this case. The present invention can also be applied a nonrecursive digital filter which has an n-stage shift register and in which the output of each output stage is multiplied by a filter coefficient and added.

Figure 5:
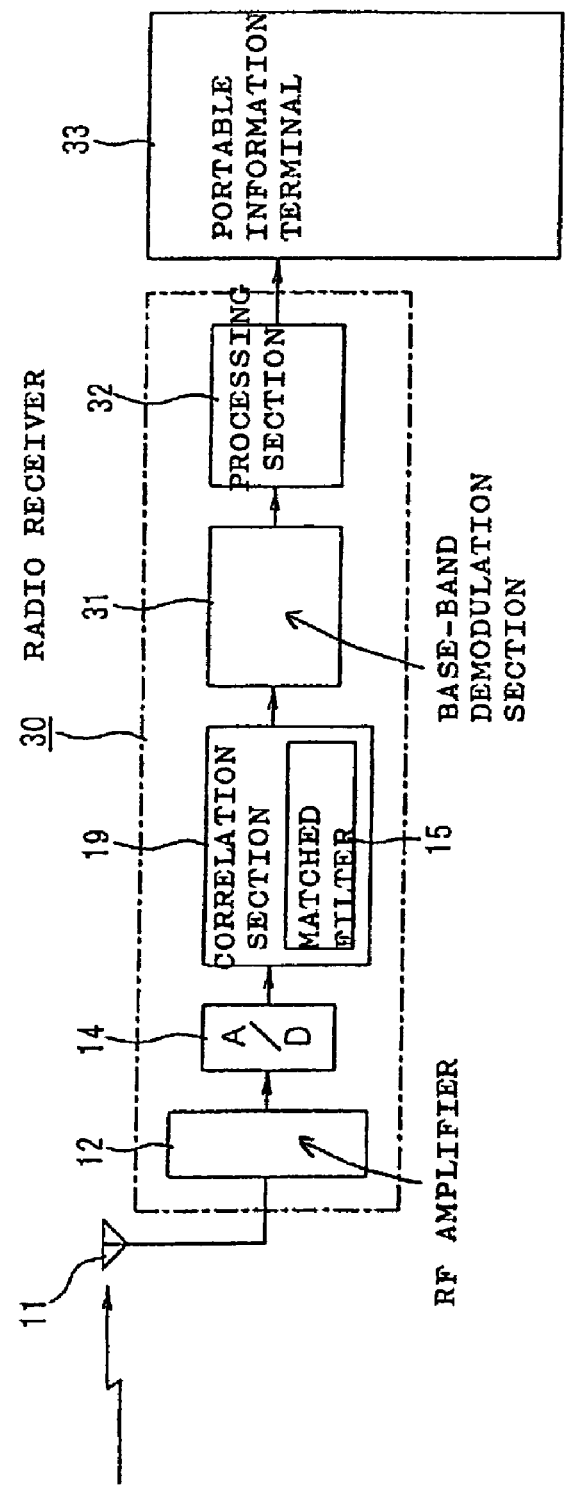
FIG. 5 is a block diagram of an embodiment in a case in which the present invention is applied to a radio receiver for a radio local-area network.

In the above embodiment, the present invention is applied to the CDMA communication system. The application is not limited to this case. As shown in FIG. 5, the present invention can also be applied to a radio receiving unit 30 for a radio local-area network which employs a spread spectrum (SS) method, in which direct spreading (DS: direct sequence or direct spread) is performed. Specifically, the radio receiving unit 30 is configured so that a signal received by the antenna 11 is amplified by the RF amplifier 12, the amplified signal is converted to a digital signal by the A/D converter 14, and the digital signal undergoes spectrum despreading by the correlation section 19 having the matched filter 15 shown in FIG. 2, and is demodulated by a base-band demodulation section 31, after which data is extracted from received packets by a packet processing section 32 and is sent to a portable information terminal 33 that requires reduced power consumption, such as notebook computers, mobile devices or the like, and the radio receiver 30 is further configured so that it receives the power it needs from the portable information terminal 33. Also in this case, since the matched filter 15 saves power in the correlation section 19, power saving of the entire radio receiving unit 30 is achieved, and a built-in battery of the portable information terminal 33 to which the radio receiving unit 30 is to be connected can be used for a longer period. The order of connections can be changed between the base-band demodulation section 31, and the A/D converter 14 and the correlation section 19. In addition, the present invention can further be applied to other radio receivers using a spreading code.

As described above, according to the invention, since each divided shift register performs a time-divisional shift operation in synchronization with the input data, it is possible to reduce the number of high-speed switching operations of the shift registers, and when a shift register is configured in n stages it is possible to reduce power consumption by reducing the clock rate of the shift clock.

In addition, according to another aspect of the invention, the n-stage shift register is divided into shift registers each having the half number of stages, one of them stores the odd-numbered parts of the spreading-code sequence and performs a shift operation at a rising edge of the shift clock, and the other stores the even-numbered parts of the spreading-code sequence and performs a shift operation at a falling edge of the shift clock. Thus, an advantage is obtained in which the clock rate of a shift clock used when the shift register is formed of n stages can be halved to save power.

Further, according to another aspect of the invention, the matched filter is provided, and for example, the first shift register sequentially shifts the odd-numbered parts of an input code sequence at rising edges of the shift clock, and the second shift register sequentially shifts the remaining parts, the even-numbered parts, of the code sequence at falling edges of the shift clock; when the shift clock is in an ON state, the first selection device outputs the even-numbered stages of the reference-code register to the first multiplication device and the second selection device outputs the odd-numbered stages of the reference-code register to the second multiplication device, and when the shift clock is in an OFF state, the first selection device outputs the odd-numbered stages of the reference-code register to the first multiplication device and the second selection device outputs the even-numbered stages of the reference-code register to the second multiplication device; and the outputs of both multiplication devices are added by adder device to obtain a correlation-strength output. Therefore, an advantage is obtained in which the first shift register and the second shift register alternately perform shift operations at both edges of the shift clock to perform a shift operation equivalent to that performed when the shift register is undivided and used, and the clock rate can be halved to save power.

Furthermore, according to another aspect of the invention, after the first and second shift registers perform shift operations, since each multiplexer performs a switching operation to alternately select the odd-numbered stages and multiple stages of the reference-code register according to the ON or OFF state of the shift clock to output the reference code to the exclusive-OR circuits to which the output of each stage of the first and second shift registers are inputted, an advantage is obtained in which the correlation output of an eight-bit code sequence is obtained by four pulses of the shift clock.

Still further, according to another aspect of the invention, the base-band signal output from the RF receiving section undergoes spectrum despreading in the correlation section to form received data and the received data is demodulated by the base-band demodulation section, or the base-band signal output from the RF receiving section is demodulated by the base-band demodulation section and undergoes spectrum despreading by the correlation section, whereby data is received in a radio local-area network, and the correlation section includes a matched filter formed of a nonrecursive digital filter according to one of those described above. Therefore, an advantage is obtained in which the power of a base-band chip, which consumes power most in the radio communication unit employing the CDMA method, can be saved, and a radio receiving unit suited to a portable information terminal which requires power saving, such as a mobile unit or a notebook personal computer, is provided.

Yet further, according to another aspect of the invention, the base-band signal output from the RF receiving section undergoes spectrum despreading in the correlation section to form received data and the received data is demodulated by the base-band demodulation section, or the base-band signal output from the RF receiving section is demodulated by the base-band demodulation section and undergoes spectrum despreading by the correlation section. Data is received in the radio local-area network. The correlation section includes a matched filter formed of a nonrecursive digital filter according to one of those described above. Therefore, an advantage is obtained in which the power of a base-band chip, which consumes power most in each radio receiving unit constituting the radio local-area network, can be saved, and the power of all of the radio receiving units constituting the radio local-area network can be saved.

What is claimed is:

1. A nonrecursive digital filter, comprising:
an n-stage shift register that sequentially shifts input data having a predetermined number n of bits, and in which the output of each output stage of the shift register is multiplied by a filter coefficient and added, the n-stage shift register including:
first and second shift registers to which the input data is input and a shift clock is inputted, each having n/2 stages obtained by dividing the n-stage shift register;
a reference-code register that stores n reference codes;
first and second selection devices that select and output odd-numbered stages and even-numbered stages of the reference-code register according to the shift clock;
a first multiplication device that multiplies an output of each stage of the first shift register by the output of the first selection device;
a second multiplication device that multiplies an output of each stage of the second shift register by the output of the second selection device; and
a correlation-strength calculation device that adds multiplication results of the first multiplication device and the second multiplication device to output a correlation strength;
wherein the first and second shift registers are configured such that one of the first and second shift registers performs a shift operation at a rising edge of the shift clock and the other performs a shift operation at a falling edge of the shift clock; and
wherein the first and second selection devices are configured such that, when the shift clock is in an ON state, one of the first and second selection devices outputs even-numbered stages of the reference-code register to the first multiplication device and the other of the first and second selection devices outputs odd-numbered stages to the second multiplication device, and when the shift clock is in an OFF state, the one of the first and second selection devices outputs the odd-numbered stages of the reference-code register to the first multiplication device and the other of the first and second selection devices outputs the even-numbered stages to the second multiplication device.

2. The nonrecursive digital filter according to claim 1, the first and second selection devices being formed of multiplexers, each being disposed for two stages of the reference-code register and selecting the odd-numbered stages and even-numbered stages thereof; the first and second multiplication devices being formed of exclusive-OR circuits; and the correlation-strength calculation device being formed of an adder.

* * * * *